United States Patent
Gimonet et al.

(10) Patent No.: US 6,963,087 B2
(45) Date of Patent: Nov. 8, 2005

(54) PULSED BISTABLE BIDIRECTIONAL ELECTRONIC SWITCH

(75) Inventors: Sophie Gimonet, Tours (FR); Franck Duclos, Tours (FR)

(73) Assignee: STMicroelectronics S.A., Montrouge (FR)

(*) Notice: Subject to any disclaimer, the term of this patent is extended or adjusted under 35 U.S.C. 154(b) by 0 days.

(21) Appl. No.: 10/221,851

(22) PCT Filed: Dec. 28, 2001

(86) PCT No.: PCT/FR01/04223

§ 371 (c)(1),
(2), (4) Date: Jul. 21, 2003

(87) PCT Pub. No.: WO02/054496

PCT Pub. Date: Jul. 11, 2002

(65) Prior Publication Data

US 2004/0026711 A1 Feb. 12, 2004

(30) Foreign Application Priority Data

Dec. 29, 2000 (FR) .............................. 00 17295

(51) Int. Cl.⁷ ............................................ H01L 29/417
(52) U.S. Cl. ..................... 257/119; 257/121; 257/107; 257/110; 257/122
(58) Field of Search ................................ 257/119, 121, 257/107, 110, 122

(56) References Cited

U.S. PATENT DOCUMENTS

| | | | |
|---|---|---|---|
| 4,244,000 A | * | 1/1981 | Ueda et al. .................. 257/110 |
| 4,612,562 A | | 9/1986 | Motojima et al. |
| 4,613,884 A | * | 9/1986 | Angerstein et al. ......... 257/115 |
| 4,914,327 A | | 4/1990 | Dekker |
| 4,943,835 A | * | 7/1990 | Yakushiji et al. ........... 257/173 |
| 4,994,884 A | * | 2/1991 | Kato et al. .................. 257/123 |
| 5,029,037 A | | 7/1991 | Bartelink |
| 5,293,051 A | * | 3/1994 | Mariyama et al. .......... 257/129 |
| 5,345,094 A | * | 9/1994 | Usui et al. .................. 257/113 |
| 5,838,110 A | | 11/1998 | Pezzani |
| 5,856,683 A | * | 1/1999 | Schlangenotto ............. 257/139 |
| 5,883,401 A | | 3/1999 | Pezzani |
| 6,017,778 A | | 1/2000 | Pezzani |
| 6,075,277 A | | 6/2000 | Pezzani |
| 6,252,257 B1 | * | 6/2001 | Duclos et al. ............... 257/119 |
| 6,380,565 B1 | * | 4/2002 | Duclos et al. ............... 257/107 |
| 6,445,561 B1 | * | 9/2002 | Michel ........................ 361/205 |
| 6,583,496 B2 | * | 6/2003 | Galtie et al. ................. 257/601 |
| 6,593,600 B1 | * | 7/2003 | Duclos et al. ............... 257/107 |

FOREIGN PATENT DOCUMENTS

EP           0 396 104 A2     11/1990

OTHER PUBLICATIONS

International Search Report from PCT/FR01/04223, filed Dec. 28, 2001.
Patent Abstracts of Japan, vol. 2000, No. 02, Feb. 29, 2000 & JP 11 307277 Nov. 5, 1999.

* cited by examiner

*Primary Examiner*—Tom Thomas
*Assistant Examiner*—Eugene Lee
(74) *Attorney, Agent, or Firm*—Lisa K. Jorgenson; James H. Morris; Wolf, Greenfield & Sacks, P.C.

(57) ABSTRACT

The invention concerns a pulsed bistable bidirectional electronic switch comprising a monolithic semiconductor circuit formed from a substrate (1) whereof the rear surface (A2) is coated with a metallization connected to earth. Said circuit comprises a vertical bidirectional switch (T1, T2) provided with a first gate terminal (M3), whereof the main electrode (A1) on the side of the front surface is connected to a load and an alternating current supply; a horizontal thyristor (T3) comprising an upper layer (4) of the vertical bidirectional switch, a first P-type region (11), and a second N-type region (12) formed in the first region; a second gate terminal (G1) connected to one of the first and second regions, the other being connected to earth. A capacitor (C) is connected to the first gate terminal (G3) and to the alternating current supply (VAC).

20 Claims, 2 Drawing Sheets

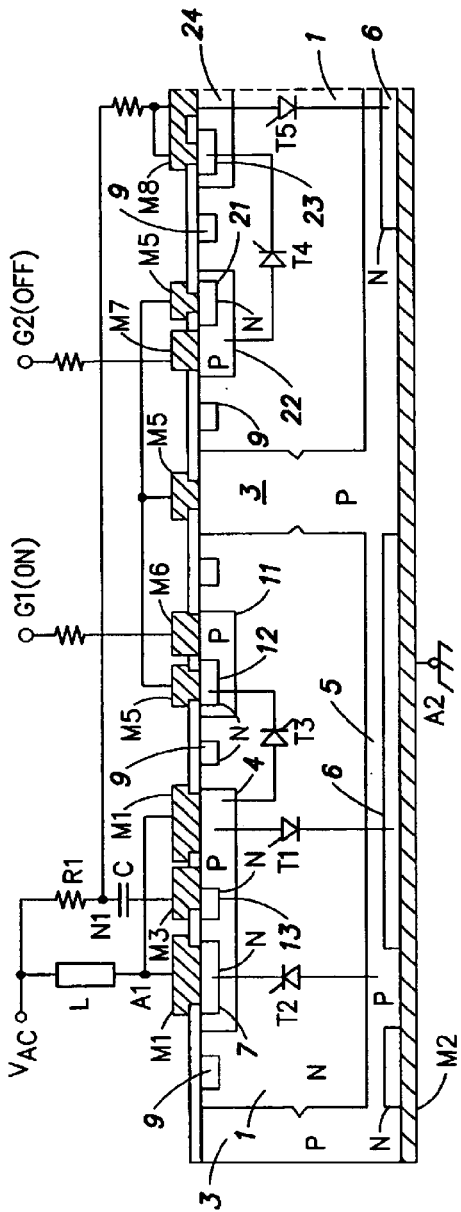
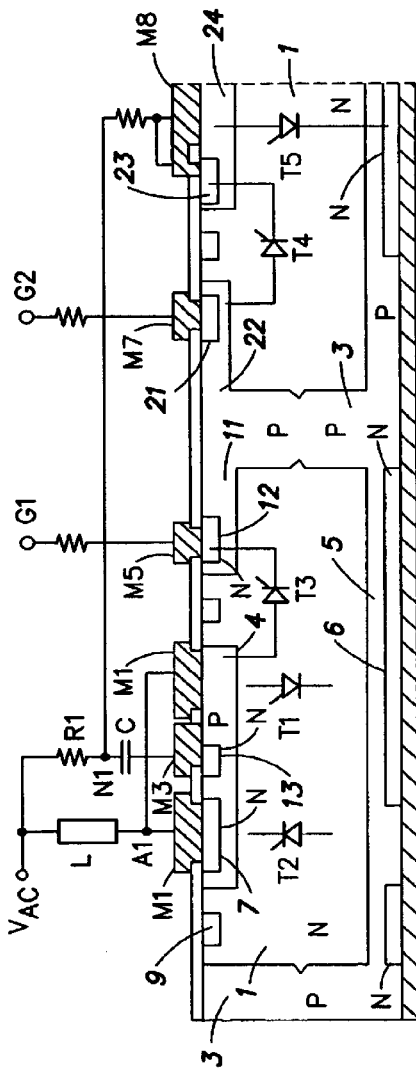
FIG. 1
FIG. 2

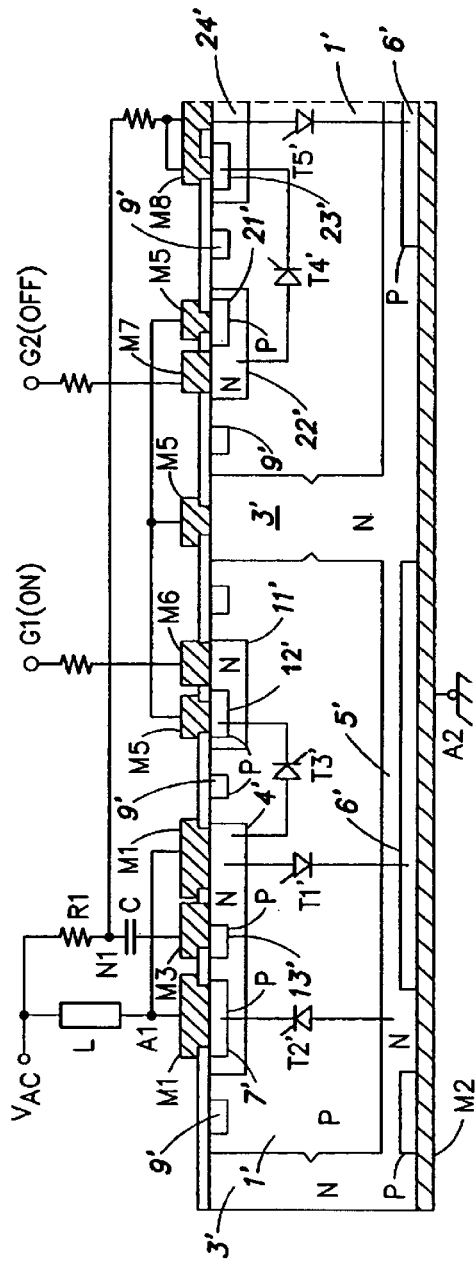
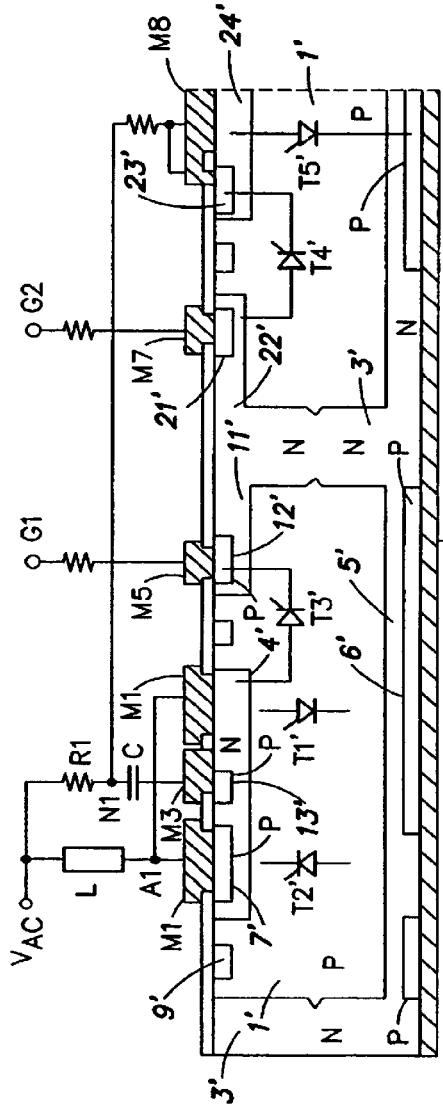
FIG. 3
FIG. 4

PULSED BISTABLE BIDIRECTIONAL ELECTRONIC SWITCH

BACKGROUND OF THE INVENTION

1. Field of the Invention

The present invention relates to a bistable bidirectional switch, that is, a switch capable of being turned on for several halfwaves of the A.C. voltage applied thereto, after a single control pulse. This bistable switch can then be turned off by application of a new pulse and remain off until it receives a new turn-on pulse.

2. Discussion of the Related Art

A first category of bidirectional switches is formed of triac-type switches or other bidirectional switches corresponding to thyristor associations. A common feature of these components is that they are turned on in a given halfwave by a pulse, and then automatically turn off when the current flowing therethrough falls under a determined threshold, generally called the hold current iH. Then, to turn such bidirectional switches back on, a pulse must be applied again upon each halfwave during which the component is desired to be on. Thus, such switches are not bistable.

Another category of bidirectional switches is formed of components of MOS or bipolar transistor type, which turn on when a signal is applied to their control terminal, but for which this control order must be continuously maintained for the component to remain on. Such transistor type components are not controllable with pulses.

In prior art, circuits associating semiconductor components and passive components in circuits enabling obtaining a pulse-controlled bistable bidirectional switch have been provided. However, such circuits are relatively complex and generally require association of several semiconductor components and of several passive components.

SUMMARY OF THE INVENTION

The present invention aims at manufacturing, in an essentially monolithic form, a pulse-controlled bistable bidirectional switch.

To achieve this and other objects, the present invention provides a bidirectional pulse-controlled bistable type switch, including:
 a monolithic semiconductor circuit formed from a lightly-doped N-type substrate having its rear surface coated with a metallization connected to a reference voltage, including:
 a vertical bidirectional switch structure provided with a first gate terminal, and having its main electrode on the front surface side connected to a load and to an A.C. power supply;
 a horizontal thyristor structure including an upper layer of the vertical bidirectional switch, the substrate, a first P-type region formed in the substrate, and a second N-type region formed in the first region;
 a second gate terminal connected to one of the first and second regions, the other one of the first and second regions being connected to the reference voltage;
 a capacitor connected to the first gate terminal and to the A.C. power supply; and
 a switch for short-circuiting the capacitor.

According to an embodiment of the present invention, the monolithic semiconductor circuit includes:
 an N-type substrate;
 on the front surface side:
 a third P-type anode region of a vertical thyristor, this third region containing a fourth N-type cathode region of a second vertical thyristor, and a fifth N-type region forming a gate region;
 on the rear surface side
 a P-type layer;
 in this P-type layer, sixth N-type regions everywhere except at the location of the anode of the second thyristor forming the vertical bidirectional switch structure.

According to an embodiment of the present invention, the first region of the horizontal switch structure extends to reach an isolating wall connecting this region to the rear surface.

According to an embodiment of the present invention, the electronic switch further monolithically includes the switch for short-circuiting the capacitor.

The foregoing objects, features and advantages of the present invention, will be discussed in detail in the following non-limiting description of specific embodiments in connection with the accompanying drawings, in which:

BRIEF DESCRIPTION OF THE DRAWINGS

FIG. 1 is a simplified cross-section view of a first embodiment of a bistable bidirectional switch according to the present invention;

FIG. 2 is a simplified cross-section view of a second embodiment of a bistable bidirectional switch according to the present invention;

FIG. 3 is a simplified cross-section view of a third embodiment of a bistable bidirectional switch according to the present invention; and FIG. 4 is a simplified cross-section view of a fourth embodiment of a bistable bidirectional switch according to the present invention.

DETAILED DESCRIPTION

As illustrated in FIG. 1, a bistable bidirectional switch according to the present invention includes a monolithic semiconductor component or circuit formed from an N-type semiconductor substrate 1 and a capacitor C.

The monolithic semiconductor component includes in its left-hand portion, surrounded by a P-type isolating wall 3, a vertical bidirectional switch structure and its turn-on structure. An assembly intended to turn the switch off is shown on the right-hand portion of the drawing.

The left-hand portion of FIG. 1 includes a vertical bidirectional switch structure connecting two thyristors in antiparallel T1 and T2. Thyristor T1 includes, from the front surface to the rear surface and from its anode to its cathode, a P-type region 4, substrate 1, a P-type region 5, and an N-type region 6. Thyristor T2 includes, from its front surface to its rear surface and from its cathode to its anode, an N-type region 7, a portion of P-type region 4, N-type substrate 1, and a portion of P-type layer 5. Although this does not appear in the drawing, in the case of a mediumpower component, this bidirectional component takes up most of the component surface area, and is intended to conduct a significant current. The other elements of the drawing are intended to turn this switch on and off.

Above-mentioned P-type layer 5 extends over the entire rear or lower surface of the component. N-type region 6 extends on the rear surface side over the entire left-hand portion of the component, except for the location where the lower surface anode portion of thyristor T2 is desired to be formed. N-type regions 9 have also been shown on the upper surface side, on either side of each P-type well, to conventionally form channel stop areas. These channel stop areas are currently coated with metallizations, not shown.

For simplicity, the assembly of two above-mentioned thyristors T1, T2 forming the bidirectional vertical structure will be called a triac TR.

The structure of the left-hand portion of FIG. 1 also includes a horizontal thyristor T3 which includes, from its anode to its cathode, P-type region 4, substrate 1, a P-type region 11 formed on the upper surface side, and an N-type region 12 formed in region 11.

P-type region 4 further includes another N-type region 13 forming the gate region of the triac.

A metallization M1 covers anode region 4 of thyristor T1 and cathode region 7 of thyristor T2. A metallization M2 covers the entire rear surface of the component. Metallization M2, which forms a terminal A2 of the triac, is connected to a reference voltage, for example, ground. Metallization M1 forms terminal A1 of the triac and is connected to an A.C. supply voltage VAC via a load L through which current is desired to be run or not. N-type gate region 13 formed in P-type region 4 is coated with a metallization M3 connected to a first terminal of a capacitor C having a second terminal connected to a node N1 of the circuit which is connected to A.C. supply voltage VAC via a resistor R1. Cathode 12 of lateral thyristor T3 is coated with a metallization M5, which is connected to another metallization M5 formed on the upper surface of isolating wall 3. Gate region 11 of lateral thyristor T3 is coated with a metallization M6 connected to a gate terminal G1.

Before explaining the operation of the device of FIG. 1, the conventional designations of the triggering modes of a bidirectional switch, for example, a triac, will be restated. A triac is said to operate in one or the other of four quadrants Q1, Q2, Q3, Q4. A reference terminal, generally grounded, is chosen, and the polarities of the voltage on the other terminal, here terminal A1, and of the gate voltage on terminal G1, are considered. The triac is said to be triggered in first quadrant Q1 when the voltages on terminals A1 and G1 are positive with respect to terminal A2. In second quadrant Q2, the voltage on terminal A1 is positive and the voltage on terminal G1 is negative. In third quadrant Q3, the voltages on terminals A1 and G1 are negative. Finally, in fourth quadrant Q4, the voltage on terminal A1 is negative and the voltage on terminal G1 is positive.

The structure shown in FIG. 1 operates in the first quadrant. This means that it can be turned on when voltage VAC is positive with respect to terminal A2 and a positive voltage is applied on gate G1. To be sure to trigger the component whatever the time at which the control pulse is applied, it will be ascertained that the control pulse duration is longer than the duration of a halfwave of the A.C. voltage, for example, 10 ms if this A.C. voltage is at 50 Hz.

When the gate pulse is applied, lateral thyristor T3 is turned on by the gate pulse on terminal G1. A current flows from terminal A1 to terminal A2, via thyristor T3 and isolating wall 3. Once the conduction of thyristor T3 has been established, carriers are injected into substrate 1 and turn on the vertical thyristor which is properly biased at this time, that is, thyristor T1. During the conduction of vertical thyristor T1, capacitor C charges with a positive voltage on node N1.

At the time when thyristor T1 turns off due to the zero crossing of the current flowing therethrough, capacitor C supplies a current through the gate of vertical thyristor T2. It should be noted that gate metallization M3 not only covers N-type region 13, but also a region close to P-type well 4. While thyristor T2 is on, capacitor C charges with a biasing which is the inverse of the former one, that is, with a negative voltage on node N1. At the next halfwave, thyristor T1 will in turn be turned on by a gate current resulting from the discharge of capacitor C.

Thus, once the initial triggering has been performed by the signal on gate G1 of auxiliary thyristor T3, the triac formed of thyristors T1 and T2 automatically starts again upon each halfwave under the effect of the discharge of capacitor C in its gate.

Once the component has been turned on, to stop its operation, capacitor C has to be discharged. For this purpose, any switch short-circuiting capacitor C may be provided. FIG. 1 shows, in its right-hand portion an example of such a switch formed in an integrated manner, formed of a horizontal thyristor T4 and of a vertical thyristor T5. The structure includes an N region 21 formed in a P well 22 and an N region 23 formed in a P well 24. Region 21 is covered with above-mentioned metallization M5. Region 22 is covered with a metallization M7 connected to a gate terminal G2. Regions 23 and 24 are coated with a metallization M8 connected to node N1. A lateral NPNP thyristor T4 including regions 22-1-24-23 and a vertical PNPN thyristor T5 including regions 24-1-5-6 have thus been obtained. N-type region 6 extends under the vertical thyristor structure on the rear surface side, and is formed at the same time as N-type regions 6 existing in the left-hand portion of the drawing.

To cause the turning-off, a positive voltage must be applied on terminal G2 during a positive halfwave. This triggers lateral thyristor T4, then vertical thyristor T5, the latter causing the discharge of capacitor C by connecting node N1 or electrode A2 set to the ground voltage.

The structure according to the present invention is likely to have various alternatives and improvements especially enabling obtaining triggerings in various quadrants.

FIG. 2 shows an example of such an alternative that can operate upon turning-on in quadrant Q2 or Q3 (and not only in quadrant Q1 as would be the case for the embodiment of FIG. 1).

In FIG. 2, same elements are designated with the same references as in FIG. 1. The structure of the main triac including thyristors T2 and T1 is substantially identical to that of FIG. 1. However, in this case, the lateral thyristor for turning on the structure has its P region 11 which extends to reach well 3 and which thus is continuous therewith. It can be seen that this structure can trigger when a negative pulse is applied on terminal G1 which, in this case, is not a gate terminal but a cathode terminal of thyristor T3. The gate, which corresponds to region 11, is grounded by isolating wall 3. A gate current thus flows when terminal G1 is at a voltage sufficiently smaller than the ground voltage to turn on the junction between regions 11 and 12. When thyristor T3 is properly biased (quadrant Q2), thyristor T3 triggers and turns on thyristor T1. When thyristor T3 is reverse-biased, junction 11-12 becomes conductive and carriers are also injected into substrate 1, which directly turns on thyristor T2.

In the turn-off structure arranged to the right of the drawing, region 22 is continuous with isolating wall 3.

The present invention is likely to have various other alternatives and modifications which will readily occur to those skilled in the art, especially as concerns modifications of the main vertical bidirectional power component and alternative embodiments of the auxiliary turn-on and turn-off elements. Further, the structure may be formed while inverting all conductivity types, for example, as shown in FIGS. 3 and 4. In FIGS. 3 and 4, an element referred to by element reference followed by the symbol "'" corresponds to an element referred to in FIG. 1 and/or FIG. 2 by an element reference that is the same, but without the "'" symbol.

The bistable bidirectional component according to the present invention could be formed individually in a silicon wafer or belong to a general structure incorporating other components of the same type, as described for example in U.S. Pat. No. 6,075,277, which is incorporated herein by reference.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A bidirectional switch of pulse-controlled bistable type, including:
    a monolithic semiconductor circuit formed from a lightly-doped N-type substrate having a rear surface coated with a metallization connected to a reference voltage, including:
    a vertical bidirectional switch structure provided with a first gate terminal, and having its main electrode on the front surface side connected to a load and to an A.C. power supply;
    a horizontal thyristor structure including an upper layer of the vertical bidirectional switch, the substrate, a first P-type region formed in the substrate, and a second N-type region formed in the first region;
    a second gate terminal connected to one of the first and second regions, the other one of the first and second regions being connected to the reference voltage;
    a capacitor connected to the first gate terminal and to the A.C. power supply; and
    a switch for short-circuiting the capacitor.

2. The electronic switch of claim 1, wherein the monolithic semiconductor circuit includes:
    an N-type substrate;
    on the front surface side:
    a third P-type anode region of a vertical thyristor, this third region containing a fourth N-type cathode region of a second vertical thyristor, and a fifth N-type region forming a gate region;
    on the rear surface side:
    a P-type layer;
    in this P-type layer, sixth N-type regions everywhere except at the location of the anode of the second thyristor forming the vertical bidirectional switch structure.

3. The electronic switch of claim 1, wherein the first region of the horizontal switch structure extends to reach an isolating wall connecting this region to the rear surface.

4. The electronic switch of claim 1, wherein the switch for short-circuiting the capacitor and the bistable pulse-controlled bidirectional switch are included in a monolithic construction.

5. A bidirectional switch of pulse-controlled bistable type, including:
    a monolithic semiconductor circuit formed from a lightly-doped P-type substrate having a rear surface coated with a metallization connected to a reference voltage, including:
    a vertical bidirectional switch structure provided with a first gate terminal, and having a main electrode on the front surface side connected to a load and to an A.C. power supply;
    a horizontal thyristor structure including an upper layer of the vertical bidirectional switch, the substrate, a first N-type region formed in the substrate, and a second P-type region formed in the first region;
    a second gate terminal connected to one of the first and second regions, another one of the first and second regions being connected to the reference voltage;
    a capacitor connected to the first gate terminal and to the A.C. power supply; and
    a switch for short-circuiting the capacitor.

6. The electronic switch of claim 5, wherein the monolithic semiconductor circuit includes:
    a P-type substrate;
    on the front surface side:
    a third N-type anode region of a vertical thyristor, this third region containing a fourth P-type cathode region of a second vertical thyristor, and a fifth P-type region forming a gate region;
    on the rear surface side:
    an N-type layer;
    in this N-type layer, sixth P-type regions everywhere except at a location of the anode of the second thyristor forming the vertical bidirectional switch structure.

7. The electronic switch of claim 5, wherein the first region of the horizontal switch structure extends to reach an isolating wall connecting this region to the rear surface.

8. The electronic switch of claim 5, wherein the switch for short-circuiting the capacitor and the bistable pulse-controlled bidirectional switch are included in a monolithic construction.

9. A bidirectional switch of pulse-controlled bistable type, including:
- a monolithic semiconductor circuit formed from a lightly-doped N-type substrate having a rear surface coated with a metallization comprising:
- a vertical bidirectional switch structure provided with a first gate terminal, and having its main electrode on the front surface side;
- a horizontal thyristor structure including an upper layer of the vertical bidirectional switch, the substrate, a first P-type region formed in the substrate, and a second N-type region formed in the first region;
- a second gate terminal connected to one of the first and second regions;
- a capacitor connected to the first gate terminal; and
- a switch for short-circuiting the capacitor.

10. The electronic switch of claim 9, wherein the monolithic semiconductor circuit includes:
- an N-type substrate;
- on the front surface side:
- a third P-type anode region of a vertical thyristor, this third region containing a fourth N-type cathode region of a second vertical thyristor, and a fifth N-type region forming a gate region;
- on the rear surface side:
- a P-type layer;
- in this P-type layer, sixth N-type regions everywhere except at the location of the anode of the second thyristor forming the vertical bidirectional switch structure.

11. The electronic switch of claim 9, wherein the first region of the horizontal switch structure extends to reach an isolating wall connecting this region to the rear surface.

12. The electronic switch of claim 9, wherein the switch for short-circuiting the capacitor and the bistable pulse-controlled bidirectional switch are included in a monolithic construction.

13. The electronic switch of claim 9, wherein the main electrode is connected to a load and to an A.C. power supply.

14. The electronic switch of claim 13, wherein the rear surface is connected to a reference voltage and wherein one of the first and second regions is connected to the reference voltage.

15. A bidirectional switch of pulse-controlled bistable type, including:
- a monolithic semiconductor circuit formed from a lightly-doped P-type substrate having a rear surface coated with a metallization comprising:
- a vertical bidirectional switch structure provided with a first gate terminal, and having a main electrode on a front surface side;
- a horizontal thyristor structure including an upper layer of the vertical bidirectional switch, the substrate, a first N-type region formed in the substrate, and a second P-type region formed in the first region;
- a second gate terminal connected to one of the first and second regions;
- a capacitor connected to the first gate terminal; and
- a switch for short-circuiting the capacitor.

16. The electronic switch of claim 15, wherein the monolithic semiconductor circuit includes:
- an P-type substrate;
- on the front surface side:
- a third N-type anode region of a vertical thyristor, this third region containing a fourth P-type cathode region of a second vertical thyristor, and a fifth P-type region forming a gate region;
- on the rear surface side:
- a N-type layer;
- in this N-type layer, sixth P-type regions everywhere except at a location of the anode of the second thyristor forming the vertical bidirectional switch structure.

17. The electronic switch of claim 15, wherein the first region of the horizontal switch structure extends to reach an isolating wall connecting this region to the rear surface.

18. The electronic switch of claim 15, wherein the switch for short-circuiting the capacitor and the bistable pulse-controlled bidirectional switch are included in a monolithic construction.

19. The electronic switch of claim 15, wherein the main electrode is connected to a load and to an A.C. power supply.

20. The electronic switch of claim 19, wherein the rear surface is connected to a reference voltage and wherein one of the first and second regions is connected to the reference voltage.

* * * * *